US006982202B2

(12) United States Patent
Hofmann et al.

(10) Patent No.: US 6,982,202 B2
(45) Date of Patent: Jan. 3, 2006

(54) FABRICATION METHOD FOR MEMORY CELL

(75) Inventors: Franz Hofmann, Munich (DE); Erhard Landgraf, Munich (DE); Hannes Luyken, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/899,436

(22) Filed: Jul. 26, 2004

(65) Prior Publication Data

US 2005/0032311 A1    Feb. 10, 2005

Related U.S. Application Data

(63) Continuation of application No. PCT/DE03/00183, filed on Jan. 23, 2003.

(30) Foreign Application Priority Data

Feb. 6, 2002    (DE) ............................... 102 04 873

(51) Int. Cl.
    *H01L 21/336* (2006.01)
(52) U.S. Cl. ...................... 438/259; 257/330
(58) Field of Classification Search ................ 438/259, 438/270, 272, 587, 589; 257/330–332
    See application file for complete search history.

(56) References Cited

U.S. PATENT DOCUMENTS 5,973,358 A    10/1999    Kishi
6,002,151 A    12/1999    Liu et al.

6,376,877 B1 *    4/2002    Yu et al. ..................... 257/317

FOREIGN PATENT DOCUMENTS

WO    WO-98/13878 A1    4/1998

OTHER PUBLICATIONS

Patent Abstracts of Japan; vol. 0161, No. 62 (E-1192), Apr. 20, 1992 & JP 4 012573 A (Matsushita Electron Corp), Jan. 17, 1992, abstract.
Patent Abstracts of Japan; vol. 0081, No. 61 (E-257), Jul. 26, 1984, & JP 59 061188 A (Toshiba KK), Apr. 7, 1984, abstract.
Eitan, B. et al.: "NROM: A Novel Localized Trapping, 2-Bit Nonvolatile Memory Cell"; IEEE Electron Device Letters, vol. 21, No. 11, Nov. 2000, pp. 543-545.

* cited by examiner

*Primary Examiner*—David Vu
(74) *Attorney, Agent, or Firm*—Darby & Darby

(57) ABSTRACT

Method of fabricating a memory cell, in which a storage layer, which is designed for programming by charge carrier trapping, and a gate electrode, which is electrically insulated from a semiconductor material, are fabricated at a top side of a semiconductor body or a semiconductor layer structure above a channel region provided between doped source-drain regions. The method includes the steps of fabricating at least one trench in the top side, providing at least portions of the trench walls which adjoin the source-drain regions to be fabricated with the storage layer, depositing a material provided for the gate electrode into the trench, forming the source-drain regions by covering the gate electrode, removing, on both sides of the trench, the semiconductor material down to an intended depth, and implanting dopant, and applying an insulation layer to the source-drain region, and fabricating an electrical connection for the gate electrode.

6 Claims, 4 Drawing Sheets

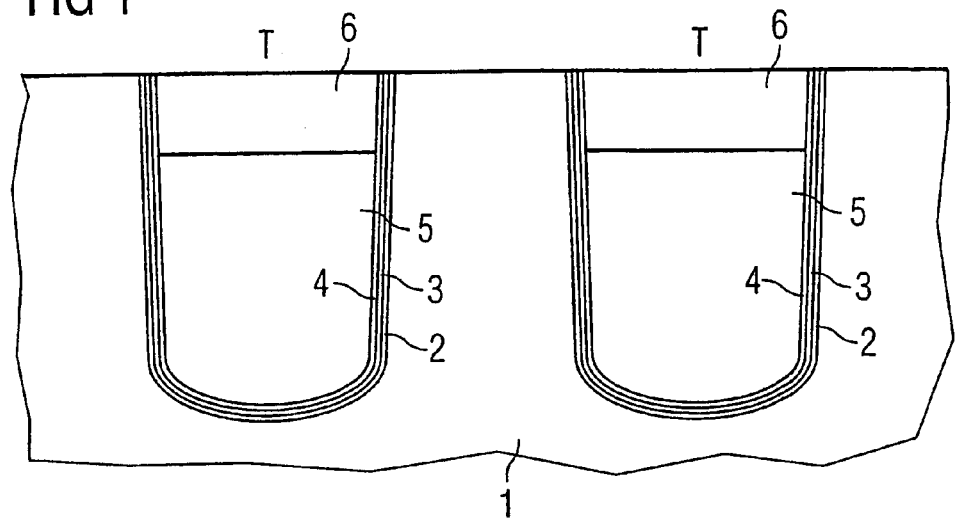
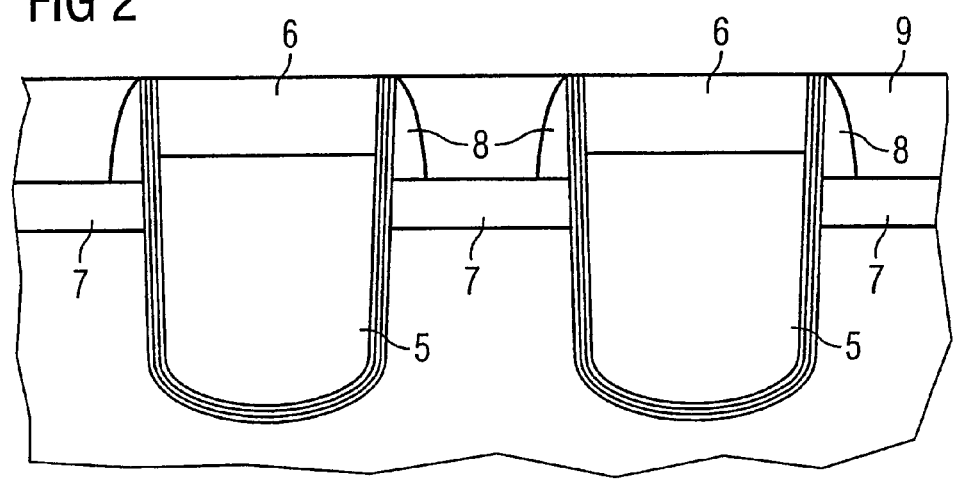

FABRICATION METHOD FOR MEMORY CELL

CROSS-REFERENCE TO RELATED APPLICATION

This application is a continuation of International Patent Application Serial No. PCT/DE03/00183, filed Jan. 23, 2003, which published in German on Aug. 14, 2003 as WO 03/067639, and is incorporated herein by reference in its entirety.

FIELD OF THE INVENTION

The present invention relates to a fabrication method for an NROM memory cell.

BACKGROUND OF THE INVENTION

The publication by B. Eitan et al.: "NROM: A Novel Localized Trapping, 2-Bit NonVolatile Memory Cell" in IEEE Electron Device Letters 21, 543 to 545 (2000), describes a nonvolatile memory cell in which an oxide-nitride-oxide layer sequence is present as storage medium between the channel region and the gate electrode, which forms a part of the word line. This memory cell is programmed by "channel hot electron injection" and erased by "tunneling enhanced hot hole injection". During programming, charge carriers are trapped in the nitride layer of the storage layer. This component has a storage capacity of 2 bits which are stored in each case at the junction between source and drain and the channel region.

This memory cell requires relatively high voltages at drain and gate for storage. This can lead to the so-called punch-through of the transistor if the latter is formed with a short channel length. The memory cells to date still have channel lengths of more than 250 nm; in this case, the occurrence of the punch-through is not as yet very pronounced.

SUMMARY OF THE INVENTION

It is an object of the present invention to specify how NROM cells with a reduced channel length and a reduced area requirement can be designed in functional fashion.

In the method specified, the NROM memory cells are arranged in trenches which are etched into the semiconductor material. The storage layer, which preferably comprises a nitride layer between oxide layers, is applied at the trench walls before the dopants for source and drain are implanted. What is achieved in this way is that the high thermal loading of the component during the fabrication of the storage layer cannot impair the implantation regions of source and drain, since the relevant dopant is only introduced subsequently. Highly delineated pn junctions are thus obtained as junction of the source-drain regions. A precise junction between the source-drain regions and the channel region is necessary for effective programming with "channel hot electrons".

The electrical connection of the gate electrode of the memory transistor, which is preferably part of a word line of a memory cell array, is led via an insulation layer which isolates this conductor from the source-drain regions. In a first embodiment of the method, said insulation layer replaces an upper layer portion of the semiconductor material; in a second exemplary embodiment, the gate electrode is made higher projecting upward above the semiconductor material, an auxiliary layer applied to the semiconductor material being used. In the case of the last-mentioned second exemplary embodiment, however, a step is produced between the region of the memory cell array and the region of the driving periphery.

BRIEF DESCRIPTION OF THE DRAWINGS

Examples of the fabrication method are described in more detail below with reference to FIGS. 1 to 8.

FIGS. 1 to 4 show cross sections of intermediate products of a first exemplary embodiment of the fabrication method.

DETAILED DESCRIPTION OF THE PREFERRED MODE OF THE INVENTION

Figure 3:
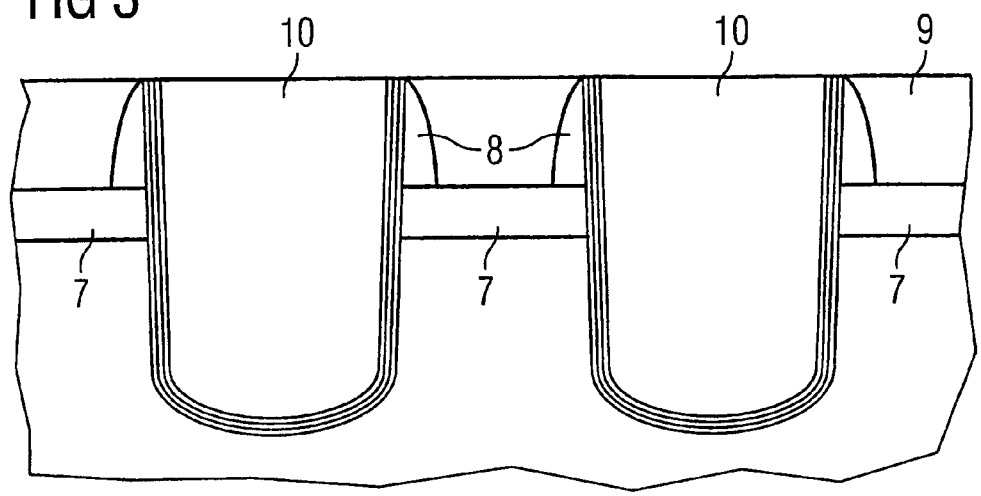

In the first exemplary embodiment, firstly a hard mask, e.g., a nitride, is applied on the top side of a semiconductor body or a semiconductor layer structure. Said hard mask defines the cell array. A photomask technique then follows, which forms a mask having a window in the region of a trench to be fabricated. Using this mask, at least one trench is etched into the semiconductor material; preferably, a plurality of trenches oriented parallel to one another are etched in order to form a memory cell array. The photoresist is removed.

FIG. 1 illustrates in cross section a detail from the semiconductor body 1 in which two trenches are fabricated in the region of the reference symbols T. The storage layer is then applied to the trench walls. The storage layer preferably comprises a first oxide layer 2, the nitride layer 3 provided as the actual storage medium, and a second oxide layer 4. Material which is provided for the gate electrode 5, preferably polysilicon, is deposited into the trench. Said material is etched back to the level depicted in FIG. 1. The hard mask is removed.

A covering layer, which is preferably nitride, is then deposited. Said covering layer is removed except for the portions of the covering layer 6 which are depicted in FIG. 1. This is preferably done by means of CMP (chemical mechanical polishing) in the case of a covering layer made of nitride. After the material of the gate electrode 5 has been covered in this way, the semiconductor material, preferably silicon, is removed down to an intended depth in the region between the trenches. Afterward, spacer elements (spacers) are fabricated on both sides of the trench filling, and a dopant provided for the source-drain regions is implanted into the semiconductor material situated between the trenches. The semiconductor body preferably has a p-conducting basic doping. In this case, the implantation of the dopant is performed for $n^+$-type conduction.

FIG. 2 shows the structure with the spacer elements 8 and the source-drain regions 7 fabricated by the implantation. These regions are additionally silicided. The insulation layer 9 is then fabricated, which may be done by application of TEOS and subsequent CMP in a manner known per se.

During the formation of a memory cell array, a multiplicity of memory cells arranged in a grid are fabricated, for which purpose the gate electrodes are interrupted at regular intervals transversely with respect to the longitudinal direction of the trenches. In the regions present in the longitudinal direction of the trenches between the memory cells to be formed, the relevant portions of the covering layer 6 and the material of the gate electrodes 5 are removed by means of a further photomask technique. After the removal of the photoresist, these regions are filled with insulating material 10, preferably likewise by deposition of TEOS and CMP, in accordance with the structure illustrated in FIG. 3. The structures illustrated in FIG. 2 and in FIG. 3 correspond to cross sections through the component which succeed one another at uniform intervals in front of and behind the plane of the drawing.

Figure 4:
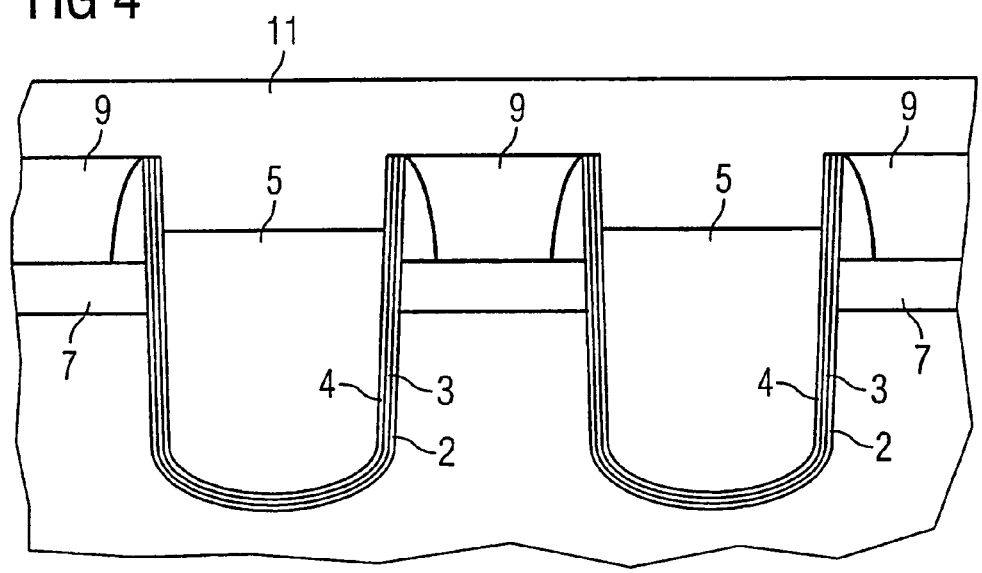

Above the remaining gate electrodes 5, a word line 11 can be applied and patterned, in accordance with FIG. 4. The material provided for this may preferably be tungsten, which is siliconized onto the polysilicon of the gate electrode.

Figure 5:
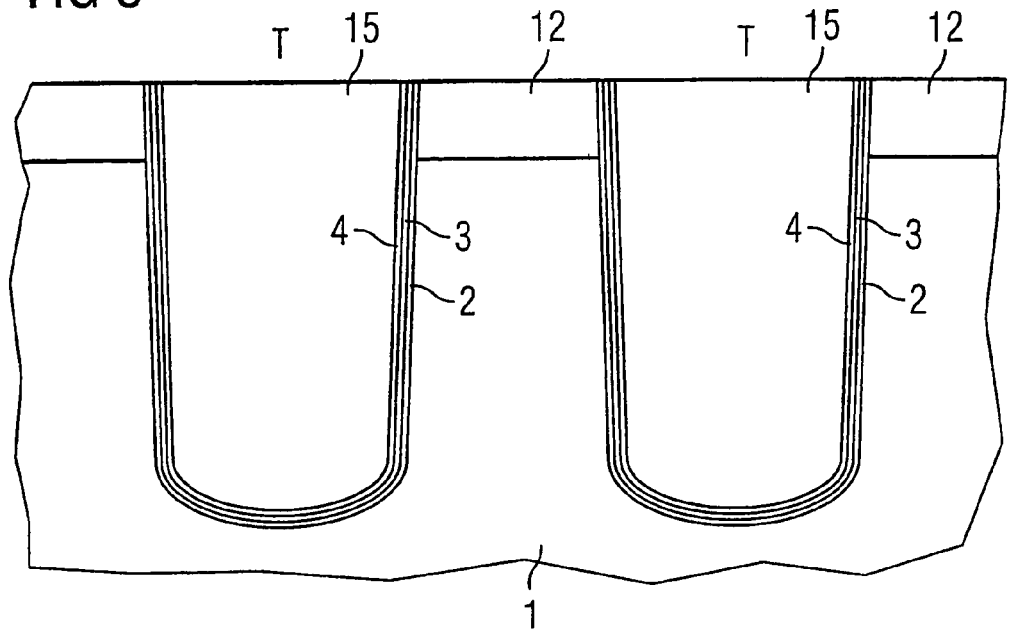
FIGS. 5 to 7 show cross sections of intermediate products of a second exemplary embodiment of the fabrication method.

In an alternative exemplary embodiment, firstly, in accordance with FIG. 5, an auxiliary layer 12, which may be e.g., a pad nitride, is applied to the top side of the semiconductor body 1 or a semiconductor layer structure. A photomask technique then follows, which fabricates a mask having openings in the region of the trenches to be fabricated. The auxiliary layer 12 is removed in these regions identified by the reference symbol T in FIG. 5. The photoresist is subsequently removed. Using the remaining portions of the auxiliary layer 12 as a mask, the trenches are then etched into the semiconductor material. The storage layer is then applied to the trench walls, which storage layer, in this case, too, is preferably a nitride layer 3 between a first oxide layer 2 and a second oxide layer 4. In accordance with the illustration of FIG. 5, the material provided for the gate electrodes 15, which is preferably polysilicon in this case, too, is introduced into the trenches and, if appropriate, removed on the surface and planarized. The auxiliary layer 12 is then removed in the region of the memory cell array to be fabricated, which is again done by means of a suitable photomask technique.

Figure 6:
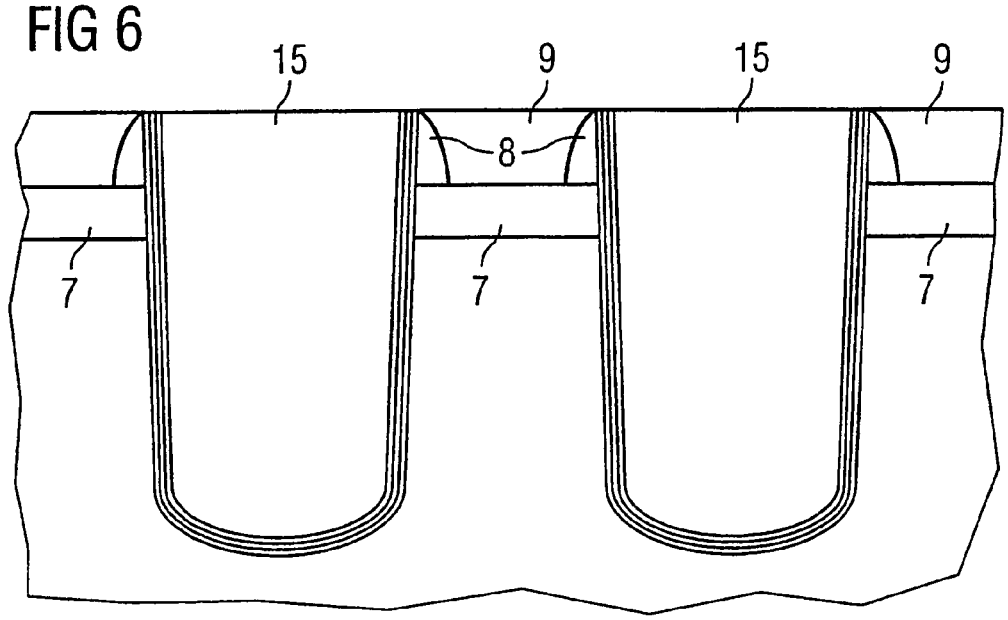

After the removal of the photoresist, the spacer elements 8 illustrated in FIG. 6 are fabricated in a manner known per se, preferably by isotropic deposition and anisotropic etching-back of a suitable material. The dopant is implanted for the source-drain regions 7, which are silicided as required. The insulation layer 9 is then applied, which, in this case, too, may be done by deposition of TEOS and subsequent CMP. The structure illustrated in FIG. 6 is thus produced. When forming a memory cell array, the material of the gate electrodes 15 is removed in the longitudinal direction of the trenches in each case between the individual memory cells and replaced by insulating material, preferably by deposition of TEOS. However with the exception of the material in the region provided with the reference symbol 15, the structure in these regions present between the memory cells corresponds to the structure represented in FIG. 6, for which reason a further drawing has been dispensed with here. After all, only the material of the gate electrodes 15 has been replaced by the insulating material at uniform intervals in front of and behind the plane of the drawing.

Figure 7:
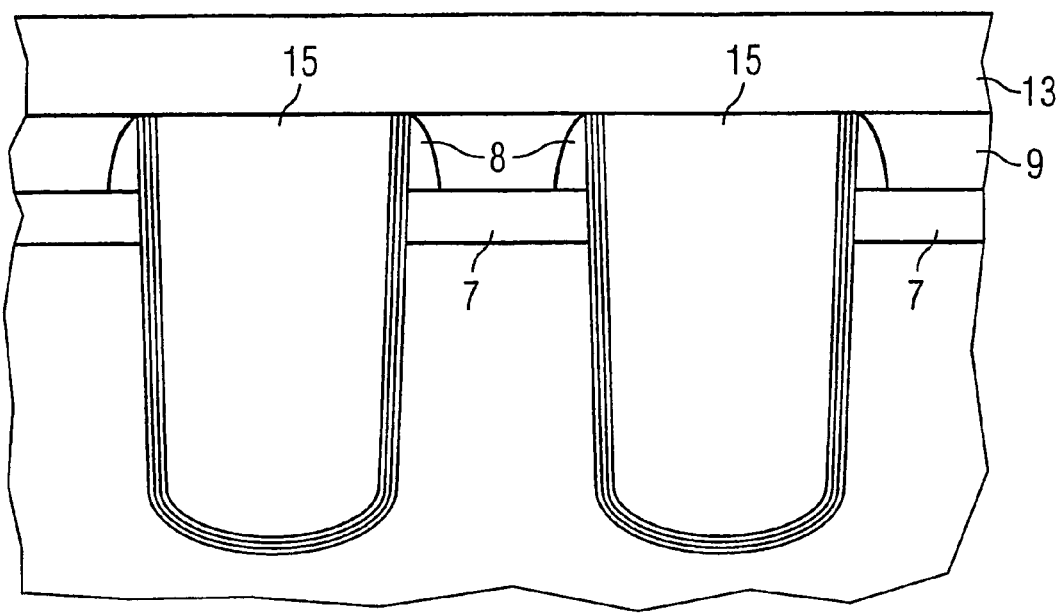

FIG. 7 illustrates the structure of the memory cell array after the application of the electrical connection of the gate electrodes 15. For this purpose, in this example, too, a word line 13, preferably made of tungsten, is applied and patterned into parallel strips.

Figure 8:
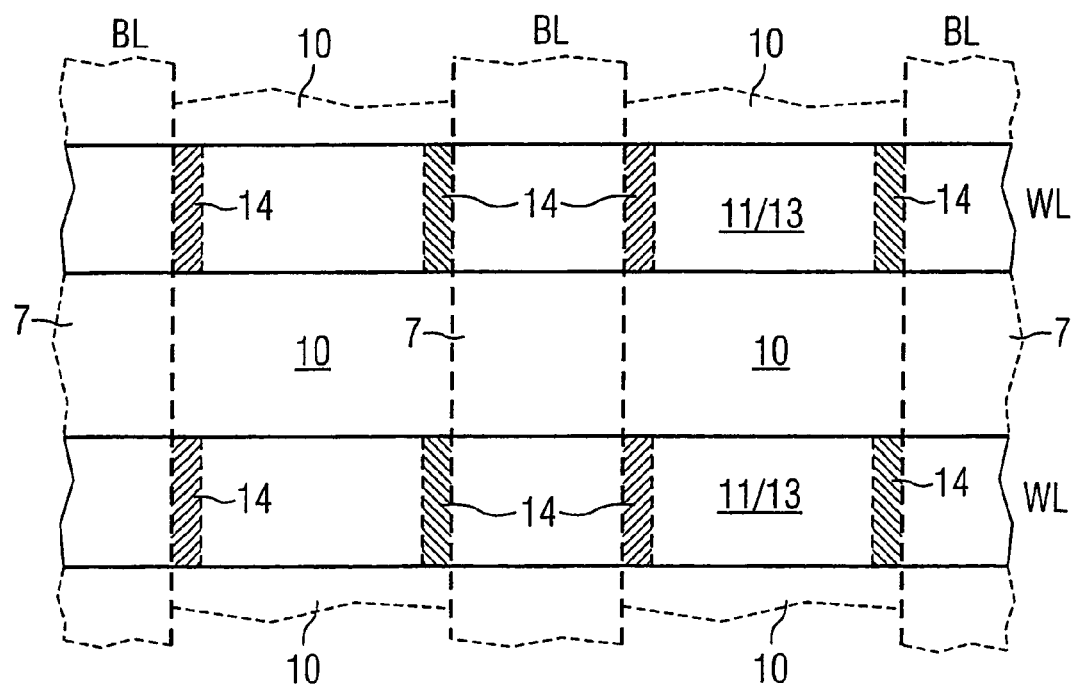
FIG. 8 shows the layout of a memory cell array in plan view.

FIG. 8 illustrates the layout of the memory cell array in a diagrammatic plan view. The orientation of the word lines WL, which are routed parallel to one another, and the orientation—running perpendicularly thereto—of the bit lines BL, which likewise run parallel to one another, are illustrated here. The bit lines are formed by the doped regions of the source-drain regions 7 of the individual memory cells, which, however, are not interrupted in the longitudinal direction of the trenches. Since the regions in the plan view shown lie hidden below the insulation layer 9, the boundaries thereof are portrayed with broken lines as concealed contours. The strip-type conductors 11/13 of the word lines are situated on the top side. Below the strip-type conductors, the respective gate electrodes of the individual memory cells are present with the same lateral delimitations. In the trenches, the material of the gate electrodes is replaced by the insulating material 10 between the word lines.

The regions 14 emphasized in hatched fashion are available for the programming which is possible on both sides in each memory cell. In these regions 14, in the vicinity of the pn junction between the source-drain regions 7 and the respective channel region, during the programming of the memory cell, charge carriers are injected into the nitride layer 3 of the storage layer sequence. It therefore suffices, in principle, if the nitride layer is present at least in these regions of the pn junction.

If, in the case of an individual memory cell, the doped region 7 on the left-hand side of the relevant trench in the figure is referred to as the drain and the doped region 7 on the right-hand side of the relevant trench in the figure is referred to as the source, the memory cell can be programmed on the left-hand side by application of the following typical voltages: 5 volts to drain, 10 volts to the control gate and 0 volts to the source. In the case of programming on the right-hand side, the voltages at source and drain are to be interchanged with one another. In order to erase the cell, typically 5 volts are in each case applied to source and drain, while minus 5 volts are applied to the control gate. In order to read out the left-hand memory content, a voltage of typically 0 volts is applied to the drain region, 2 volts to the control gate and 1.2 volts to source. In order to read out the memory content present on the right, the voltages of source and drain are interchanged.

What is claimed is:

1. A method of fabricating a memory cell, in which a storage layer, which is designed for programming by charge carrier trapping, and a gate electrode, which is electrically insulated from a semiconductor material, are fabricated at a top side of a semiconductor body or a semiconductor layer structure above a channel region provided between doped source-drain regions, comprising the steps of:
    fabricating at least one trench in the top side;
    providing at least portions of the trench walls which adjoin the source-drain regions to be fabricated with the storage layer;
    depositing a material provided for the gate electrode into the trench;
    forming the source-drain regions by covering the gate electrode, removing, on both sides of the trench, the semiconductor material down to an intended depth, and implanting dopant; and
    applying an insulation layer to the source-drain region, and fabricating an electrical connection for the gate electrode.

2. The method as claimed in claim 1, further comprising the steps of:
    fabricating a cell array;
    providing the source-drain regions as bit lines; and
    designing the electrical connections of the gate electrodes as word lines.

3. The method as claimed in claim 1, further comprising the step of applying the storage layer as an oxide-nitride-oxide layer sequence.

4. A method of fabricating a memory cell, in which a storage layer, which is designed for programming by charge carrier trapping, and a gate electrode, which is electrically insulated from the semiconductor material, are fabricated at a top side of a semiconductor body or a semiconductor layer structure above a channel region provided between doped source-drain regions, comprising the steps of:

applying an auxiliary layer to the top side;

fabricating at least one trench in the auxiliary layer and the semiconductor material present underneath;

providing at least portions of the trench walls which adjoin the source-drain regions to be fabricated with the storage layer;

depositing a material provided for the gate electrode into the trench;

forming the source-drain regions by removing the auxiliary layer and, on both sides of the trench, implanting dopant; and applying an insulation layer to the source-drain regions and fabricating an electrical connection for the gate electrode.

5. The method as claimed in claim 4, further comprising the steps of:

fabricating a cell array;

providing the source-drain regions as bit lines; and designing the electrical connections of the gate electrodes as word lines.

6. The method as claimed in claim 4, further comprising the step of applying the storage layer as an oxide-nitride-oxide layer sequence.

* * * * *